United States Patent
Kamath et al.

(10) Patent No.: US 11,012,034 B2
(45) Date of Patent: *May 18, 2021

(54) DIGITAL ISOLATOR

(71) Applicant: TEXAS INSTRUMENTS INCORPORATED, Dallas, TX (US)

(72) Inventors: Anant Shankar Kamath, Bangalore (IN); Sreeram N S, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 406 days.

This patent is subject to a terminal disclaimer.

(21) Appl. No.: 16/023,277

(22) Filed: Jun. 29, 2018

(65) Prior Publication Data

US 2018/0323746 A1    Nov. 8, 2018

Related U.S. Application Data

(63) Continuation of application No. 15/640,168, filed on Jun. 30, 2017, now Pat. No. 10,038,403, which is a continuation of application No. 14/103,386, filed on Dec. 11, 2013, now Pat. No. 9,698,728.

(60) Provisional application No. 61/736,994, filed on Dec. 13, 2012.

(51) Int. Cl.
*H03D 3/00* (2006.01)
*H04L 25/02* (2006.01)

(52) U.S. Cl.
CPC ........... *H03D 3/00* (2013.01); *H04L 25/0268* (2013.01)

(58) Field of Classification Search
CPC .................................. H03K 7/06; H03D 3/00
See application file for complete search history.

(56) References Cited

U.S. PATENT DOCUMENTS

| | | | |
|---|---|---|---|
| 8,238,477 B2 | 8/2012 | Zocher et al. | |
| 9,698,728 B2* | 7/2017 | Kamath | H03D 3/00 |
| 10,038,403 B2* | 7/2018 | Kamath | H04L 25/0268 |
| 2004/0150474 A1 | 8/2004 | Wortel | |
| 2008/0278256 A1 | 11/2008 | Harvey | |
| 2010/0073137 A1* | 3/2010 | Kobayashi | G06K 19/0723 340/10.1 |
| 2011/0286243 A1 | 11/2011 | Hsu et al. | |

* cited by examiner

*Primary Examiner* — Jeffrey M Shin
(74) *Attorney, Agent, or Firm* — Michael A. Davis, Jr.; Charles A. Brill; Frank D. Cimino

(57) ABSTRACT

Several circuits and methods for transferring an input data signal in a digital isolator are disclosed. In an embodiment, the digital isolator includes an isolation element, input circuit, and output circuit. The isolation element includes at least one input node and at least one output node, the input circuit is electronically coupled to the input node and generates modulated differential data signals based on modulating the input data signal on a carrier signal. The input circuit operates using a first supply voltage with respect to a first ground. The output circuit is electronically coupled to the output node to receive the modulated differential data signals, operates using a second supply voltage with respect to a second ground and includes a frequency-shift keying demodulator configured to generate a demodulated data signal in response to detection of presence of the carrier signal. The output circuit further generates an output data signal.

20 Claims, 11 Drawing Sheets

DIGITAL ISOLATOR

CROSS REFERENCE TO RELATED APPLICATIONS

Under 35 U.S.C. § 120, this continuation application claims benefits of and priority to U.S. patent application Ser. No. 15/640,168, filed on Jun. 30, 2017, which is a continuation of U.S. patent application Ser. No. 14/103,386, filed on Dec. 11, 2013, which claims the benefit of U.S. Provisional Patent Application No. 61/736,994, filed on Dec. 13, 2012. The entirety of the above-referenced applications are hereby incorporated herein by reference by reference.

TECHNICAL FIELD

The present disclosure generally relates to the field of digital isolators.

BACKGROUND

In accordance with an example scenario, isolation is implemented to separate one circuit or circuit section from undesired influences of other circuits or circuit sections. For example, in an electrical circuit, a dielectric is implemented to block direct current between isolated circuit sections of the electrical circuit. Indeed, one example scenario provides that a number of digital isolators are implemented, wherein such digital isolators are devices used to achieve isolation by blocking low-frequency currents between the circuits while allowing transfer of a digital signal, through, for example, induction, electromagnetic or optical links. Each digital isolator makes use of an isolation barrier or an isolation element in order to transfer the digital signal, wherein the isolation barrier includes one or more capacitors or transformers. However, high-frequency transients (also referred to as common mode transients (CMT)) are caused as a result of different supply voltages and grounds that are present at different circuits or circuit sections, and the high-frequency transients can corrupt data transmission of the digital signal across the isolation barrier. It is noted that addressing the effect of the CMT in the digital isolators is a challenge in designing the digital isolators.

SUMMARY

This Summary is provided to introduce a selection of concepts in a simplified form that are further described below in the detailed description. This Summary is not intended to identify key or essential features of the claimed subject matter, nor is it intended to be used as an aid in determining the scope of the claimed subject matter.

Various circuits and methods for transferring an input data signal in a digital isolator are disclosed. In an embodiment, a digital isolator includes an isolation element, an input circuit, and an output circuit. The isolation element includes at least one input node and at least one output node. The input circuit is electronically coupled to the at least one input node and is configured to receive an input data signal in order to generate modulated differential data signals based on modulating the input data signal on a carrier signal of a carrier frequency. The input circuit operates using a first supply voltage with respect to a first ground. The input circuit is further positioned to provide the modulated differential data signals to the at least one input node. The output circuit is electronically coupled to the at least one output node such that the output circuit is positioned to receive the modulated differential data signals. The output circuit is configured to operate using a second supply voltage with respect to a second ground. The output circuit includes a frequency-shift keying (FSK) demodulator configured to detect a presence of the carrier signal in the modulated differential data signals and generate a demodulated data signal in response to the presence of the carrier signal. The output circuit is further configured to generate an output data signal in response to the demodulated data signal.

In an embodiment, a frequency-shift keying demodulator including a demodulation comparator, a pull-up element, and a first switched capacitor circuit is disclosed. The demodulation comparator includes a first input terminal and a second input terminal. The first input terminal is electronically coupled to a node and the second input terminal is positioned to receive a reference signal. The demodulation comparator is configured to generate a demodulated data signal in response to a difference between a voltage signal at the node and the reference signal. The pull-up element electronically couples a supply voltage to the node. The first switched capacitor circuit is configured to generate the voltage signal at the node. The first switched capacitor circuit further includes a first switching capacitor, a first switch, and a second switch. The first switching capacitor includes a first terminal and a second terminal. The first terminal of the first switching capacitor is electronically coupled to a ground. The first switch is positioned to electronically couple the second terminal of the first switching capacitor to the ground in order to provide a discharge path to the first switching capacitor. The first switch is further controlled by a first phase signal that includes a signal modulated with a carrier frequency. The second switch is positioned to electronically couple the second terminal of the first switching capacitor to the node in order to provide a charging path to the first switching capacitor from the supply voltage. The second switch is controlled by a second phase signal that includes the signal modulated with the carrier frequency.

Additionally, in an embodiment, a method of transferring an input data signal in a digital isolator is disclosed. In an embodiment, the method includes generating modulated differential data signals based on modulating the input data signal on a carrier signal of a carrier frequency. Additionally, the method includes implementing an isolation element to transfer the modulated differential data signals from an input circuit to an output circuit. The input circuit operates using a first supply voltage with respect to a first ground, and the output circuit operates using a second voltage supply with respect to a second ground. The method also includes implementing a frequency-shift keying (FSK) demodulator to generate a demodulated data signal in response to a presence of the carrier signal in the modulated differential data signals. The method further includes generating an output data signal by level shifting of the demodulated data signal.

Other aspects and example embodiments are provided in the drawings and the detailed description that follows.

The drawings referred to in this description are not to be understood as being drawn to scale except if specifically noted, and such drawings are only exemplary in nature.

DETAILED DESCRIPTION

Digital isolators are used for implementing safety isolation, improving system performance, and reducing cost in noisy high-voltage applications, for example factory automation, process control, computer peripherals and data acquisition systems. The digital isolators use transformers, capacitors, etc., to magnetically or capacitively transfer data across an isolation barrier. Isolation ensures data transfer without an electrical connection or a leakage path that might create a safety hazard. However, the isolation also imposes constraints in delays, power consumption, cost and size. An example digital isolator (that is not in accordance with example embodiments of the present invention) is explained with reference to FIG. 1.

Figure 1:
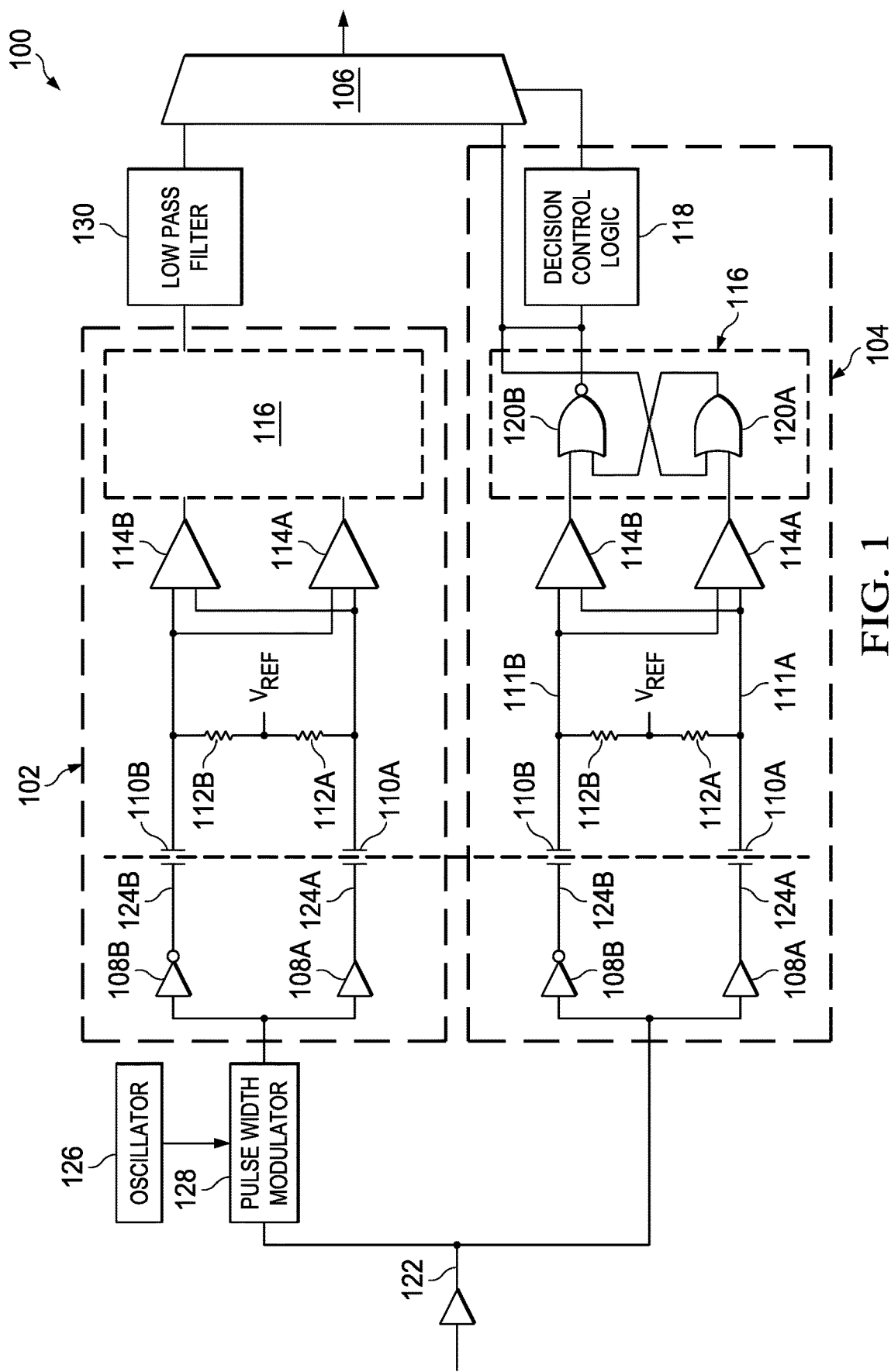
FIG. 1 is a circuit diagram of an example digital isolator, in accordance with an example scenario.

FIG. 1 is a circuit diagram of a digital isolator 100, in accordance with an example scenario, based on a capacitive isolation barrier technique. The capacitive isolation barrier technique uses an electric field for data transmission from one side (for example, an input side) to another side (for example, an output side). The digital isolator 100 includes a low-frequency channel circuit 102, a high-frequency channel circuit 104, and an output multiplexer 106. The low-frequency channel circuit 102 operates on a low-frequency channel covering a bandwidth range from 100 kilo bytes per second (kbps) to a very low or zero frequency, for example, direct current (DC). The high-frequency channel circuit 104 operates on a high-frequency channel with a bandwidth from 100 kbps up to 150 mega bytes per second (Mbps). In some forms, the digital isolator 100 also includes an oscillator 126 (OSC), a pulse width modulator (PWM) 128, and a low pass filter (LPF) 130 in association with the low-frequency channel circuit 102. If an input data signal 122 is a low frequency signal, the input data signal 122 is not transmitted across the sides (for example, from the input side to the output side). The PWM 128 hence pulse width modulates the input data signal 122 with a carrier signal of a carrier frequency (generated by the OSC 126) to convert the input data signal 122 from the low frequency signal to a high frequency signal for transmission across the sides. The LPF 130 further removes the carrier signal (of a high carrier frequency) from an output signal of the low-frequency channel circuit 102 before providing the output signal to the output multiplexer 106.

The high-frequency channel circuit 104 includes a non-inverting gate 108A, an inverting gate 108B, an isolation capacitor 110A, an isolation capacitor 110B, a resistor 112A, a resistor 112B, a comparator 114A, a comparator 114B, a flip-flop 116, and a decision control logic (DCL) 118.

The input data signal 122 is received at the high-frequency channel circuit 104 at inputs of the non-inverting gate 108A and the inverting gate 108B. The input data signal 122 is converted to a signal 124A via the non-inverting gate 108A, and into a signal 124B (that is complementary of the signal 124A) via the inverting gate 108B. The signal 124A and 124B form a differential signal, as the input data signal 122 is split into the signals 124A and 124B. Capacitor-resistor networks formed by the isolation capacitor 110A, the resistor 112A, the isolation capacitor 110B, and the resistor 112B, differentiate the signal 124A and the signal 124B into signal transients (111A and 111B). A reference voltage (VREF) generated by the resistor 112A and the resistor 112B sets a DC bias level on the signal transients which then are converted into differential pulses by the comparator 114A (having a positive threshold) and the comparator 114B (having a negative threshold). Outputs of the comparator 114A and the comparator 114B set and reset the flip-flop 116. As long as a positive input of the comparator 114A (or the comparator 114B) is on a higher potential than its negative input, output of the comparator 114A (or the comparator 114B) presents a logical high, thus converting a signal transient into a pulse. Output of the flip-flop 116 is provided to the output multiplexer 106. The DCL 118 at the output of the flip-flop 116 measures durations between the signal transients. If a duration between two consecutive signal transients exceeds a certain time limit, (as in case of a low-frequency signal), the DCL 118 forces the output multiplexer 106 to switch from the high-frequency channel to the low-frequency channel.

The digital isolator 100 transfers the input data signal 122 by edge-based transmission using bit transitions that appear as the differential pulses across the isolation capacitors (the isolation capacitor 110A and the isolation capacitor 110B). The digital isolator 100 uses a DC refresh channel (not shown in FIG. 1) to convey failsafe information, and recover from errors. However, such usage of the DC refresh channel leads to overheads in both area and power consumption. The data transmission is not continuous in the edge-based transmission, leading to degradation in performance of the digital isolator 100. Further, presence of glitches in the edge-based transmission end up in the digital isolator 100 being locked-up in a wrong state. Also, recovery time of the digital isolator 100 is high if an edge transition or a bit transition is missed. The digital isolator 100 is further susceptible to common mode transients that are generated due to the potential difference between grounds.

Various embodiments of the present technology provide solutions that are capable of reducing power consumption and area requirement in digital isolators and that are capable of providing improved common mode transient immunity (CMTI) in the digital isolators, and these solutions overcome the above described and other limitations, in addition to providing currently unavailable benefits. Various embodiments of the present technology are herein disclosed in conjunction with FIGS. 2-9.

Figure 2:
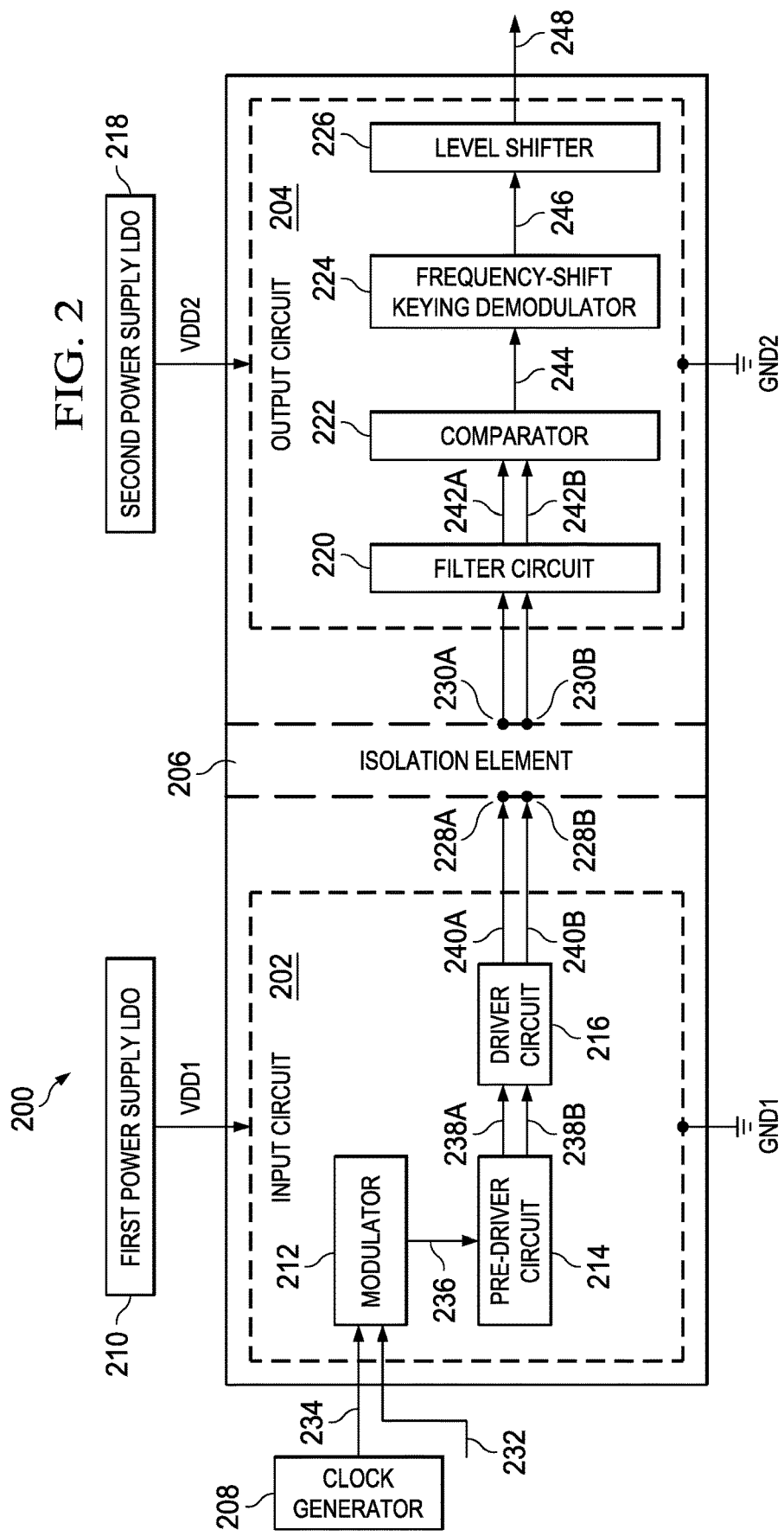
FIG. 2 is a block diagram of an example digital isolator, in accordance with an embodiment.

Referring to FIG. 2, a block diagram of an example digital isolator, for example a digital isolator 200, having reduced area and power consumption and improved CMTI is shown, in accordance with an example embodiment. The digital isolator 200 includes an input circuit 202, an output circuit 204, and an isolation element 206. The input circuit 202 includes a clock generator 208, a first power supply low dropout regulator (LDO) 210, a modulator 212, a pre-driver circuit 214, and a driver circuit 216. The output circuit 204 includes a second power supply LDO 218, a filter circuit 220, a comparator 222, a frequency-shift keying (FSK) demodulator 224, and a level shifter 226. The isolation element 206 includes at least one input node, for example an input node 228A and an input node 228B, and at least one output node, for example an output node 230A and an output node 230B.

In one form, the input circuit 202 and the output circuit 204 are present on a same die or on a separate die, and operate with different power and ground supplies. The input circuit 202 operates using a first supply voltage (VDD1), received from the first power supply LDO 210, with respect to a first ground (GND1). The output circuit 204 operates using a second supply voltage (VDD2), received from the second power supply LDO 218, with respect to a second ground (GND2). In one example, GND1 and GND2 have a ground potential difference of 10 kilovolts. Herein in this description, change in the ground potential difference between the input circuit 202 and the output circuit 204 is referred to as a common mode transient (CMT) event. In an example, the CMTI of the digital isolator 200 is checked when transmitting Data 0 or Data 1 with the ground potential difference being changed linearly. Slope of the change in the ground potential difference defines strength of the CMT event. For example, change of the ground potential difference from −400V to +400V has the strength of the CMT event as 50 kV/μS.

When the CMT event occurs, there will be charge transfer or current source/current sink from the input circuit 202 to the output circuit 204 in order to charge the isolation element 206 and adjust the voltage across the isolation element 206 to the ground potential difference between the input circuit 202 and the output circuit 204. In one example, current (for example, current source or the current sink) is about 6 mA for the isolation element 206 of 100 femto Farads (fF) and a load resistor of 300 ohms (Ω).

The isolation element 206, for example a capacitor, an inductor, or a transformer, in the digital isolator 200 isolates the input circuit 202 from the output circuit 204 and handles high voltages signal transfer between the input circuit 202 and the output circuit 204. The isolation element 206 enables transfer of an input data signal 232 from the input circuit 202 that operates with VDD1 and GND1, to the output circuit 204 that operates with VDD2 and GND2. The isolation element 206 handles the potential difference between GND1 and GND2 and isolates the GND1 and GND2 from each other. In some embodiments, the isolation element 206 is located either within the input circuit 202 or within the output circuit 204. In other embodiments, the isolation element 206 is located on a separate die between the input circuit 202 and the output circuit 204.

An example of working of the digital isolator 200 is described as follows. The modulator 212 in the input circuit 202 operates to receive the input data signal 232, and a carrier signal 234 from the clock generator 208. The modulator 212 modulates the input data signal 232 on the carrier signal 234 to generate a modulated data signal 236. For instance, Data 1 in the input data signal 232 is coded as a stream of the carrier signal 234 and Data 0 in the input data signal 232 is coded as an absence of the carrier signal 234. Amplitude of the input data signal 232 while transmitting the carrier signal 234 is allowed to vary especially during the CMT event as the modulation scheme is FSK instead of amplitude-shift keying (ASK). In one form, the modulator 212 uses an on-off keying (OOK) modulation scheme of FSK modulation to generate the modulated data signal 236 for transmission to the output circuit 204. In some embodiments, the carrier signal 234 is generated by the clock generator 208. The clock generator 208 is a voltage controlled ring oscillator (VCO), which converts a clock signal into the carrier signal 234 using a switched capacitor potential divider in a closed loop scheme.

The pre-driver circuit 214 is responsive to the modulated data signal 236 to provide modulated complementary signals (238A and 238B). The driver circuit 216 amplifies the modulated complementary signals (238A and 238B) to generate the modulated differential data signals (240A and 240B). The first power supply LDO 210 is able to sink or source large currents present during the CMT event. When the current is sourced or sinked based on the modulated differential data signals (240A and 240B) (depending on the voltages at the input circuit 202 and the output circuit 204) from the first power supply LDO 210, the current is sourced or sinked based on the modulated differential data signals (240A and 240B) (depending on the voltages at the input circuit 202 and the output circuit 204) from GND1. Current of the first power supply LDO 210 depends on the modulated differential data signals 240A and 240B. However, current due to the CMT event depends primarily on the potential difference between GND1 and GND2.

In some instances, voltage generated by the first power supply LDO 210 shows large overshoot and undershoot during the CMT event. However, the digital isolator 200 is unaffected as the data is modulated based on the carrier frequency.

The modulated differential data signals 240A and 240B generated by the input circuit 202 is fed to the isolation element 206 for transferring it to the output circuit 204.

The filter circuit 220 of the output circuit 204 generates filtered modulated differential data signals (242A and 242B) by attenuating CMT signal components from the modulated differential data signals (240A and 240B) and by attenuating signal components including frequencies less than a carrier frequency (for example, 1 Giga Hertz (GHz)) of the carrier signal 234. In an example, the filter circuit 220 includes a high pass filter or a band pass filter. The comparator 222 amplifies the signals 242A and 242B provided by the filter circuit 220 to generate an amplified modulated data signal 244 that is a single ended signal. The FSK demodulator 224 is configured to detect a presence of the carrier signal 234 in the modulated differential data signals (242A and 242B) and to generate a demodulated data signal 246 (using FSK demodulation) based on either the presence of the carrier signal 234 (Data 1) or absence of the carrier signal 234 (Data 0) in the signal 244. It should be noted that in some embodiments, the FSK demodulator 224 is configured to generate a demodulated data signal 246 based on the modulation performed at the input circuit 202. For example, the Data 1 is modulated with a first carrier frequency and the Data 0 is modulated with second carrier frequency, and in such examples, the FSK demodulator 224 is configured to demodulate the Data 1 and Data 0 based on the presence of the first carrier frequency and the second carrier frequency, respectively. In some embodiments, the FSK demodulator 224 in the digital isolator 200 is replaced with an envelope detector. The level shifter 226 is responsive to the demodulated data signal 246 to level shift the demodulated data signal 246 to generate an output data signal 248. In this manner, various embodiments of the present technology enable transfer of the input data signal 232 from the input circuit 202 to the output circuit 204 across the isolation element 206.

In some embodiments, the first power supply LDO 210 in the input circuit 202 includes a global LDO and a local LDO (not shown in FIG. 2). The global LDO handles currents at low speeds and high accuracy, whereas the local LDO handles high currents at an increased speed and relatively lower accuracy than the global LDO. In some embodiments, as many circuits in the input circuit 202 operate using the local LDO for lower power and better power supply rejection ratio (PSRR). In one example, the driver circuit 236 operates using a 1.8V supply provided by the local LDO, whereas the pre-driver circuit 214 operates using a 1.8V supply provided by the global LDO.

In some embodiments, the voltage of the first power supply LDO 210 increases and decreases during the CMT event. However, as the FSK modulation and demodulation is used in the digital isolator 200 instead of the ASK or other amplitude depending modulations, any undesirable change in the voltage of the first power supply LDO 210 does not affect signal transfer across the isolation element 206. The isolation element 206 hence maintains data integrity as there is no loss of data in the input data signal 232 during the signal transfer even at changing potential difference values between GND1 and GND2. The digital isolator 200 thereby transfers the input data signal 232 in an area and power efficient manner.

Figure 3:
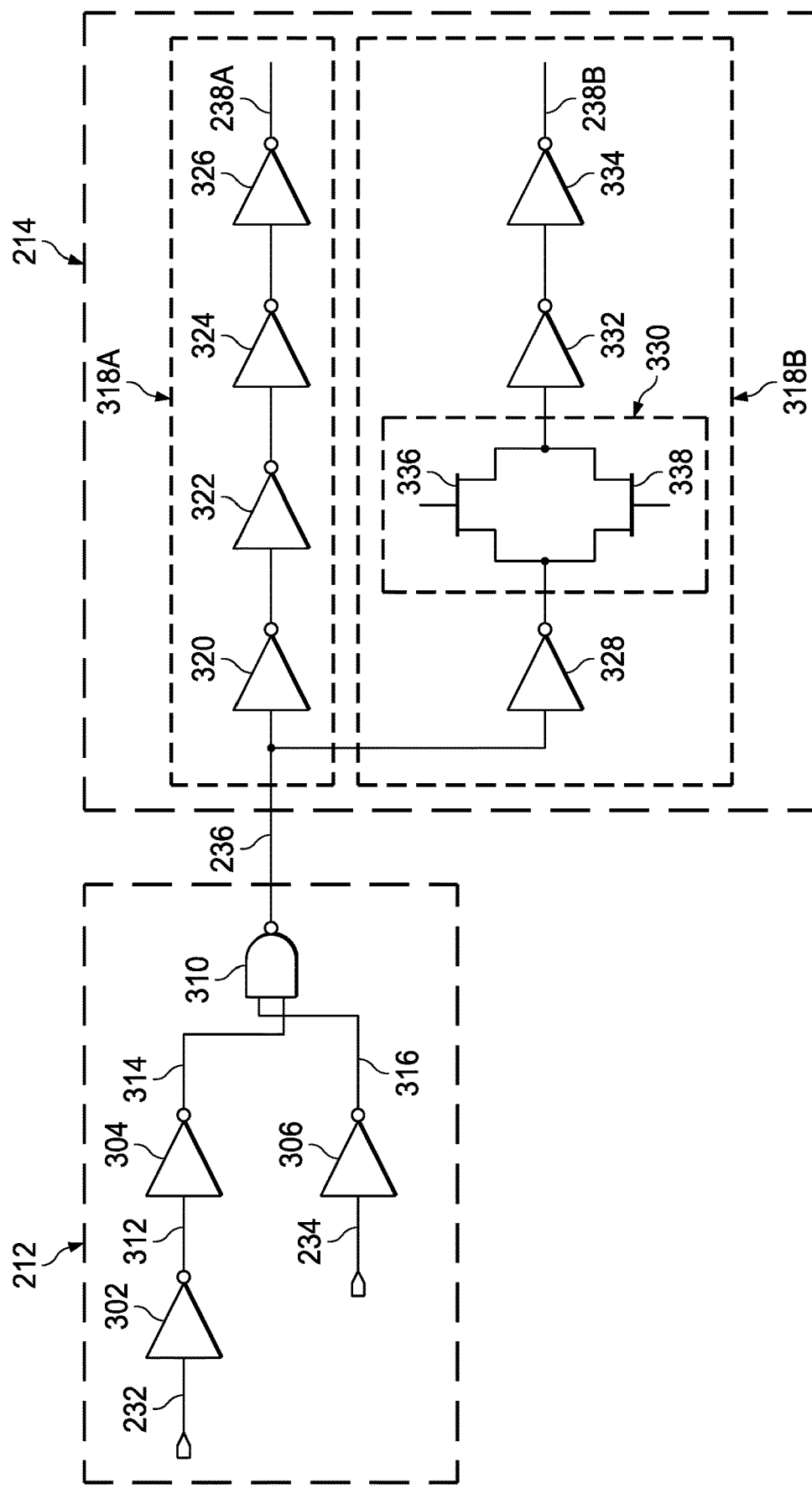
FIG. 3 is a circuit diagram of an example modulator and an example pre-driver circuit, in accordance with an embodiment.

Referring now to FIG. 3, a circuit diagram of the modulator 212 is shown, in accordance with an example embodiment. The modulator 212 includes a plurality of inverters, for example an inverter 302, an inverter 304, and an inverter 306, and a negated AND (NAND) gate 310. In this example embodiment, the modulation is performed by the NAND gate 310. However, in alternate embodiments, the modulation is performed by logic gates other than the NAND gate 310. The modulator 212 operates with VDD1 received from the first power supply LDO 210. The inverter 302 receives the input data signal 232. An inverted signal 312 is generated by the inverter 302 in response to the input data signal 232, and an inverted signal 314 is generated by the inverter 304 in response to the inverted signal 312. The inverter 306 receives the carrier signal 234. An inverted signal 316 is generated by the inverter 306 in response to the carrier signal 234. The inverted signal 316 is applied to a first input terminal of the NAND gate 310 and the inverted signal 314 is applied to a second input terminal of the NAND gate 310. The NAND gate 310 performs modulation of the input data signal 232 on the carrier signal 234 to generate a modulated data signal 236. If the input data signal 232 is at logic level 1, the NAND gate 310 generates the modulated data signal 236 that is a toggling signal with the frequency of the carrier signal 234. If the input data signal 232 is at logic level 0, the modulated data signal 236 is a steady zero.

As shown in FIG. 3, the pre-driver circuit 214 includes a first path 318A and a second path 318B. In an embodiment, the pre-driver circuit 214 operates with VDD1 received from the first power supply LDO 210. The first path 318A and the second path 318B receive the modulated data signal 236. The first path 318A includes a plurality of inverters, for example an inverter 320, an inverter 322, an inverter 324, and an inverter 326. The inverter 320, the inverter 322, the inverter 324, and the inverter 326 are electronically coupled in a series connection and arranged in order of increasing strength. The second path 318B includes an inverter 328, a non-inverting pass gate 330, an inverter 332, and an inverter 334, also electronically coupled in a series connection. The non-inverting pass gate 330 includes a positive metal oxide semiconductor (PMOS) transistor 336 and a negative metal oxide semiconductor (NMOS) transistor 338. It should be noted that the first path 318A includes even number of inverters (for example, 4) and the second path 318B includes odd number of inverters (for example, 3) and one buffer (for example, non-inverting pass gate 330) so as to maintain equal path delay. Accordingly, the pre-driver circuit 214 generates the modulated complementary signals (238A and 238B) in the first path 318A and the second path 318B respectively. The modulated complementary signals (238A and 238B) are fed to the driver circuit 216.

Figure 4:
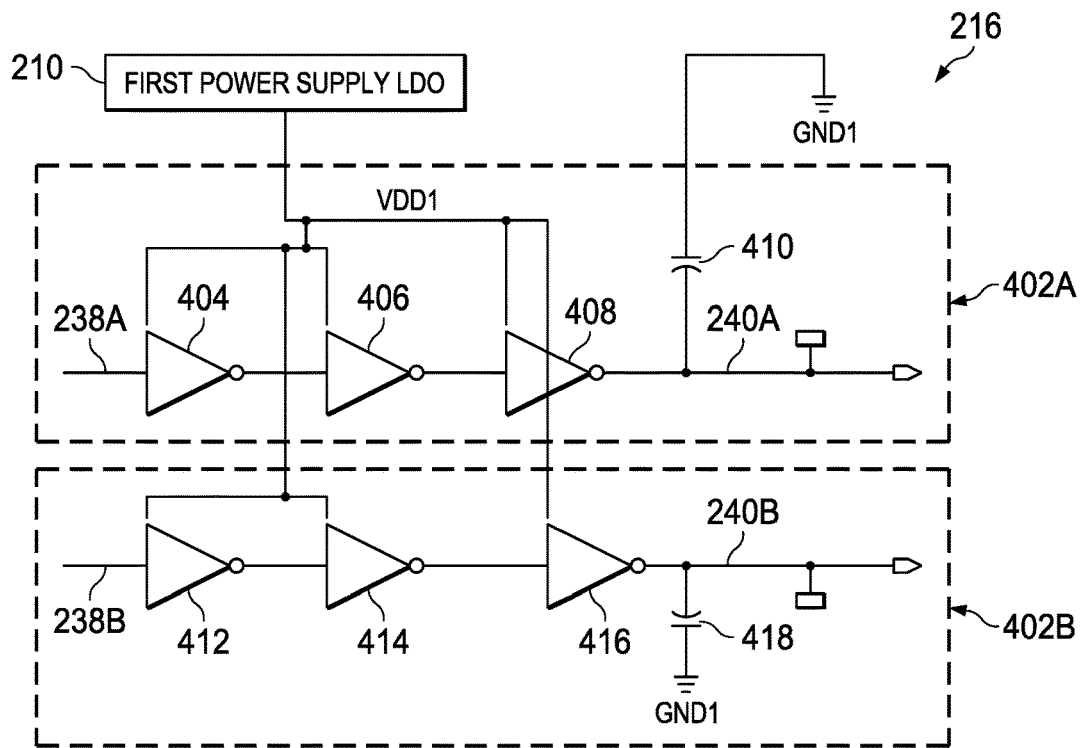
FIG. 4 is a circuit diagram of an example driver circuit, in accordance with an embodiment.

Referring now to FIG. 4, a circuit diagram of the driver circuit 216 is shown, in accordance with example embodiment. The driver circuit 216 includes a first driver path 402A and a second driver path 402B. The driver circuit 216 operated with the VDD1 received from the first power supply LDO 210. In one example, the driver circuit 216 is a pseudo-differential driver having differential outputs. The first driver path 402A and the second driver path 402B receive the modulated complementary signals (238A and 238B) from the pre-driver circuit 214, respectively. The first driver path 402A includes a plurality of inverters, for example an inverter 404, an inverter 406, and an inverter 408. The first driver path 402A also includes a capacitor 410. The inverters 404, 406, and 408 are electronically coupled in a series connection and are arranged in order of increasing strength. The capacitor 410 is electronically coupled between output of the inverter 408 and GND2. The second driver path 402B includes a plurality of inverters, for example an inverter 412, an inverter 414, and an inverter 416. The second driver path 402B also includes a capacitor 418. The inverters 412, 414 and 416 are electronically coupled in a series connection and increase in strength. The capacitor 418 is electronically coupled between output of the inverter 416 and GND2. The first path 402A and the second path 402B amplify the modulated complementary signals (238A and 238B) to generate the modulated differential data signals (240A and 240B), respectively.

The data signals 240A and 240B are provided to the output circuit 204 through the isolation elements 206. In some embodiments, the isolation element 206 is configured in the output circuit 204. Specifically, the isolation element 206, for example, a capacitor, is configured in the filter circuit 220 of the output circuit 204, and such configuration of the filter circuit 220 is described with reference to FIG. 5.

Figure 5:
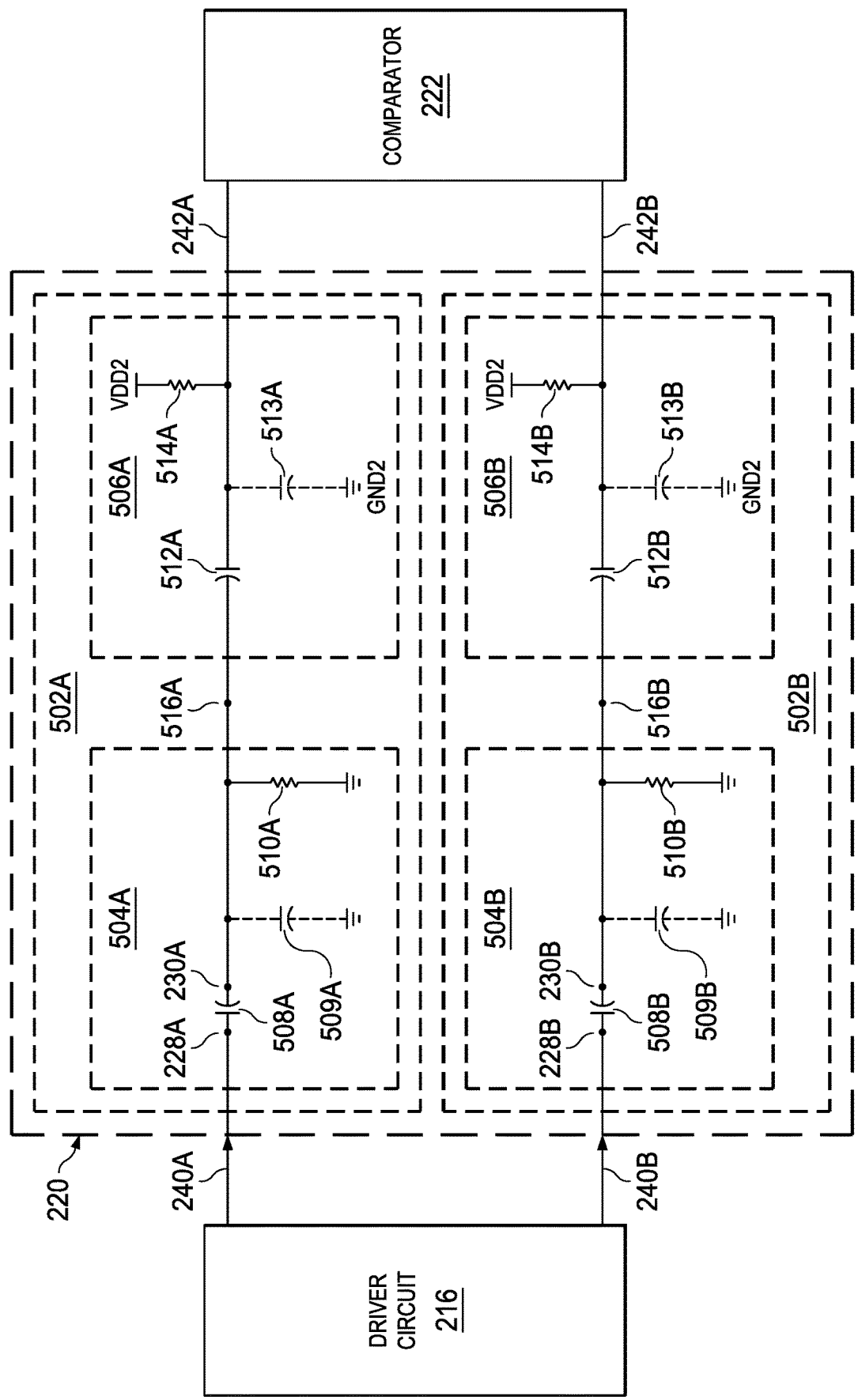
FIG. 5 is a circuit diagram of an example filter circuit, in accordance with an embodiment.

Referring now to FIG. 5, a circuit diagram of the filter circuit 220 and its connection with other components are shown, in accordance with an example embodiment. In an example, the filter circuit 220 includes the high pass filter configured to pass the carrier frequency and attenuate low frequencies along with CMT. The filter circuit 220 as explained below is a second order high pass filter and is extended to higher order filters. The filter circuit 220 receives the modulated differential data signals (240A and 240B), from the driver circuit 216. The filter circuit 220 includes a pair of high pass filter circuits, for example a first high pass filter circuit 502A and a second high pass filter circuit 502B, responsive to the modulated differential data signals 240A and 240B, respectively. The first high pass filter circuit 502A includes a first stage filter 504A and a second stage filter 506A. In this embodiment, the isolation element (for example, the isolation element 206) is configured by two isolations capacitors 508A and 508B, positioned in the first high pass filter circuit 502A and the second high pass filter circuit 502B, respectively. As shown in FIG. 5, the first stage filter 504A includes the isolation capacitor 508A and a first bias resistor 510A. The second stage filter 506A includes a capacitor 512A and a second bias resistor 514A. Similarly, the second high pass filter circuit 502B includes a first stage filter 504B and a second stage filter 506B. The first stage filter 504B includes the isolation capacitor 508B and a first bias resistor 510B. The second stage filter 506B includes a capacitor 512B and a second bias resistor 514B.

The signal 240A is received at the isolation capacitor 508A, and the signal 240B is received at the isolation capacitor 508B. Parasitic capacitances (509A and 509B) for the isolation capacitor 508A and the isolation capacitor 508B, respectively, are inherently present in the filter circuit 220, and it should be noted that the parasitic capacitances are shown for illustrative purposes only and these are not any physical components. In some embodiments, the first signal 240A is attenuated by the isolation capacitor 508A and the second signal 240B is attenuated by the isolation capacitor 508B due to presence of the parasitic capacitances. The first stage filter 504A generates a first stage filtered data signal 516A in response to the signal 240A. The second stage filter 506A is configured to filter the first stage filtered data signal 516A to generate the signal 242A. Similarly, the first stage filter 504B generates a first stage filtered data signal 516B in response to the signal 240B. The second stage filter 506B is configured to filter the first stage filtered data signal 516B to generate the signal 242B. The parasitic capacitances (513A and 513B) for the capacitor 512A and the capacitor 512B, respectively, are inherently present in the filter circuit 220, and it should be noted that the parasitic capacitances are shown for illustrative purposes only and these are not any physical components. The second stage filter 506A and the second stage filter 506B are used to pass the carrier signal 234 with minimum attenuation and reject CMT with maximum attenuation.

In some embodiments, the filter circuit 220 provides a low impedance path for CMTI current without attenuating the carrier frequency present in the signals 240A and 240B. The filter circuit 220, being a second or higher order filter, is capable of attenuating the CMT event in effective manner, since a larger separation is created by the frequency domain between the CMT event (low frequency) and the carrier signal 234 (high frequency). Also, if the CMT event is considered as a ramp event with a linear increase in voltage, the first stage filtered data signal 516A of the first stage filter 504A (or the first stage filtered data signal 516B of the first stage filter 504B) resembles a trapezoid during the CMT event, but the signal 242A received from the second stage filter 506A (or the signal 242B received from the second stage filter 506B) resembles a pulse. Hence the second or higher order filter helps in reducing duration of the CMT event as seen by the comparator 222.

In some embodiments, the first bias resistor 510A (or the first bias resistor 510B) is biased to GND2 instead of to a DC voltage, thereby saving power and area of a voltage source needed to provide the DC voltage. The first bias resistor 510A (or the first bias resistor 510B) handles most of the current during the CMT event that further goes to GND2. The second bias resistor 514A (or the second bias resistor 514B) handles less current during the CMT event and is biased using a high-impedance voltage source.

When Data 0 is received during the CMT event, a change in the output of the input circuit 202 and a differential signal for the CMT event duration is double filtered by the filter circuit 220, so that the input to the comparator 222 is a pulse. If amplitude of the pulse is higher than a threshold of the comparator 222, it is detected by the comparator 222 and the pulse is fed to the FSK demodulator 224. However, if the pulse is a solitary pulse, the FSK demodulator 224 rejects the pulse resulting in no degradation in the data.

When Data 1 is received during the CMT event, there is change in both the output of the input circuit 202 and amplitude of the carrier signal 234 due to presence of the carrier signal 234. If the amplitude of the carrier signal 234 at the input to the comparator 222 fluctuates as compared with the threshold of the comparator 222, the comparator 222 operates inefficiently. Further, in some cases the comparator 222 fails to detect the pulse at the input to the comparator 222 due to signal loss. However, if the pulse is an occasional missing pulse in the carrier signal 234, the pulse is filtered by the FSK demodulator 224 resulting in no degradation in the data.

The filter circuit 220, being the second order filter, sees the CMT event lasting for a short time duration as compared to an entire duration seen by the first order filter. In some embodiments, the comparator 222 misses a cycle or two of the carrier signal 234 which is further filtered out by the FSK demodulator 224. In some embodiments, the carrier frequency of the carrier signal 234 is chosen such that there is a large frequency difference between the carrier and the CMT to increase performance of the filter circuit 220.

The filtered modulated differential data signals (for example, the signals 242A and 242B) are further provided to the comparator 222. In one example, the comparator 222 is an offset corrected comparator in which an offset is introduced and corrected by the comparator 222 to reject noise at input of the comparator 222. Due to offset correction there is a reduction in area and power of the comparator 222. The comparator 222 converts the signals 242A and 242B into complementary metal oxide semiconductor (CMOS) levels and generates the amplified modulated data signal 244. Due to the attenuation through the isolation element 206 and due to slight attenuation during filtering by the filter circuit 220, the signals 242A and 242B have low amplitude. The comparator 222 is used to gain up the signals 242A and 242B back to the CMOS levels. In one example, low amplitudes of 100 millivolts (mV) of the signals 242A and 242B is gained up to 1.8V CMOS levels.

In some embodiments, the comparator 222 includes three differential stages to amplify the signals 242A and 242B back to the CMOS levels. The comparator 222 also includes a DC correction loop to address random mismatches between components in the comparator 222. The output of the comparator 222 (for example, the amplified modulated data signal 244) is provided to the FSK demodulator 224 that is configured to demodulate Data 1 and Data 0 based on the received data signal 244.

Figure 6A:
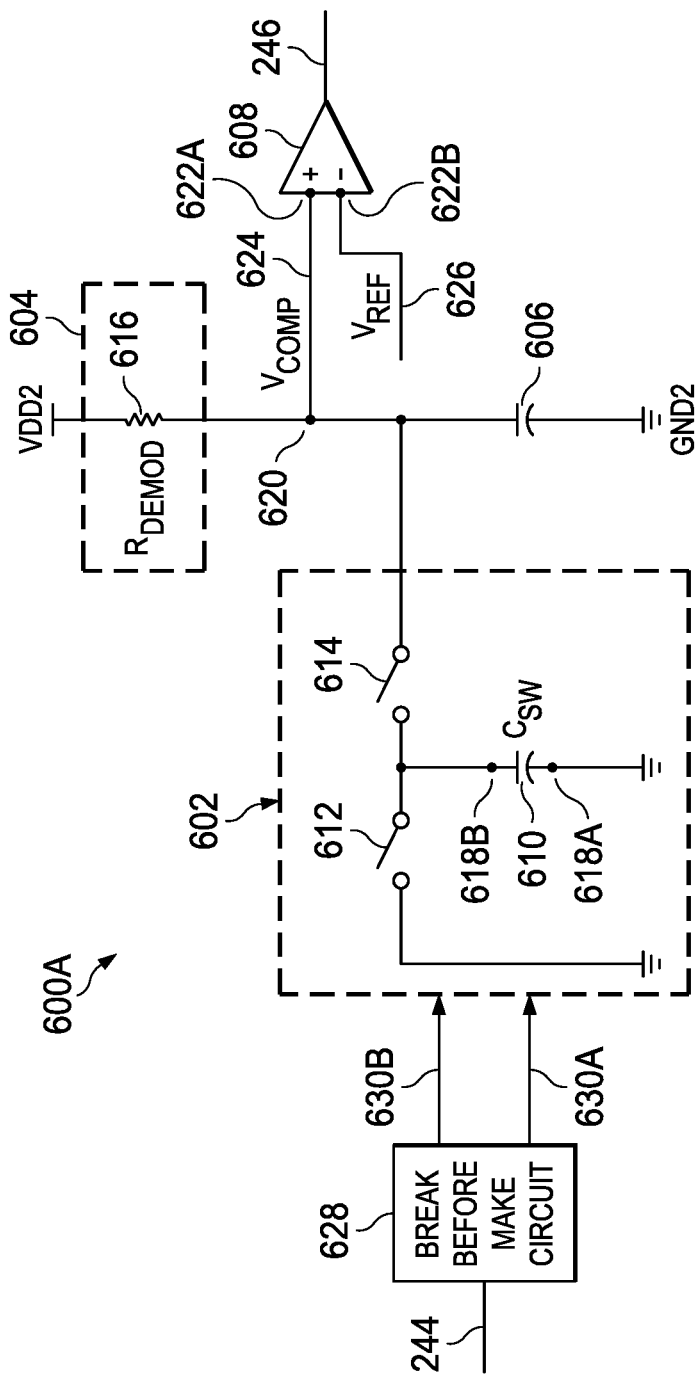
FIGS. 6A-6D are circuit diagrams of example frequency-shift keying (FSK) demodulators, in accordance with various embodiments.

Referring now to FIG. 6A, an example of the FSK demodulator 224 (for example, an FSK demodulator 600A) is shown, in accordance with an example embodiment. The FSK demodulator 600A includes a switched capacitor circuit 602, a pull-up element 604, an averaging capacitor 606, and a demodulation comparator 608. The switched capacitor circuit 602 includes a switching capacitor 610, a first switch 612, and a second switch 614. The pull-up element 604 includes a resistor 616.

During transfer of the input data signal 232 from the input circuit 202 to the output circuit 204, there can be changes in capacitance value of the isolation capacitors (508A and 508B) and changes in voltages due to the CMT that cause a change in amplitude of the input data signal 232. The carrier frequency, however, remains unchanged for the change in amplitude of the input data signal 232 as the FSK demodulator 600A performs the FSK demodulation taking into consideration only the carrier frequency. The FSK demodulator 600A performs another level of filtering to filter out the CMT that are of the low frequencies.

The switching capacitor 610 includes a first terminal 618A and a second terminal 618B. The first terminal 618A is electronically coupled to GND2. The first switch 612 electronically couples the second terminal 618B of the switching capacitor 610 to GND2. The second switch 614 is electronically coupled between the second terminal 618B of the switching capacitor 610 and a node 620. The pull-up element 604 is electronically coupled between VDD2 and the node 620. The averaging capacitor 606 is electronically coupled between the node 620 and GND2. A first input terminal 622A of the demodulation comparator 608 is electronically coupled to the node 620 and is configured to receive a voltage signal ($V_{COMP}$) 624 from the node 620. A second input terminal 622B of the demodulation comparator 608 is configured to receive a reference signal ($V_{REF}$) 626. The reference signal 626 is received from the second power supply LDO 218.

In some embodiments, the FSK demodulator 224 includes a break before make circuit 628 that generates a first phase signal 630A and a second phase signal 630B in response to the amplified modulated data signal 244 received from the comparator 222 being modulated with the carrier frequency. The first phase signal 630A and the second phase signal 630B are complementary and non-overlapping clock signals due to which the first switch 612 and the second switch 614 are not simultaneously closed thereby preventing charging and discharging of the switching capacitor 610 at a same time. The first phase signal 630A and the second phase signal 630B are generated using digital logic inside that is present in the break before make circuit 628. Frequencies of the first phase signal 630A and the second phase signal 630B depend upon the presence of the carrier frequency in the first phase signal 630A and the second phase signal 630B.

The first switch 612 is controlled by the first phase signal 630A and provides a discharge path to the switching capacitor 610. The second switch 614 is controlled by the second phase signal 630B and provides a charging path to the switching capacitor 610 from VDD2. The switched capacitor circuit 602 is configured to generate the voltage signal 624 at the node 620. The averaging capacitor 606 reduces ripple on the voltage signal 624 ($V_{COMP}$). The demodulation comparator 608 is configured to generate the demodulated data signal 246 in response to a difference of the voltage signal 624 at the node 620 and the reference signal 626. Threshold of the demodulation comparator 608 for FIG. 6A is explained with reference to the equation (1) as given below:

$$VDD2 * R_{SW}/(R_{SW} + R_{DEMOD}) = V_{REF} \quad (1)$$

Where, $R_{SW}$ is resistance of the switching capacitor 610 and $R_{SW}$ is resistance of the resistor 616. Further, $R_{SW} = 1/(fclk * C_{SW})$, where fclk is the carrier frequency and $C_{SW}$ is capacitance of the switching capacitor 610. For frequencies higher than the threshold frequency (for example, for carrier frequency being higher than the threshold frequency), $V_{COMP}$ is less than $V_{REF}$, and the output of the comparator 608 is low. Similarly, for zero frequency or frequencies less than the threshold (for example, carrier frequency is not present in the signals 630A and 630B), the $V_{COMP}$ is greater than $V_{REF}$, and the output of the comparator 608 is high.

In some embodiments, the FSK demodulator 600A includes a switched-capacitor potential divider (not shown in FIG. 6A) that converts a frequency input into a resistance, and the resistance to a voltage through potential division. The amplified modulated data signal 244 controls the switching capacitor 610 and the resistor 616. When the carrier signal 234 is present, $R_{SW}$ is low and output of the switched-capacitor potential divider is lower than a known reference ($V_{REF}$) that is generated using the second power supply LDO 218. When the carrier signal 234 is absent, $R_{SW}$ is high and the output of the switched-capacitor potential divider is higher than the $V_{REF}$ fed to the comparator 608. The FSK demodulator 224 does not use a local oscillator but relies on resistor capacitor (RC) time constants as a reference to detect the carrier frequency.

When the demodulated data signal 244 provided to the FSK demodulator 600A includes the carrier frequency, $R_{SW}$ is low, and the output of the FSK demodulator 600A is also low. The demodulated data signal 244 is then detected as Data 1. When the demodulated data signal 244 provided to the FSK demodulator 600A is a steady DC voltage, $R_{SW}$ is high, and the output of the FSK demodulator 600A is also high. The demodulated data signal 244 is then detected as Data 0. The break before make circuit 628 is used to prevent through currents in two switches 612 and 614 used in the switched capacitor potential divider.

Figure 6B:
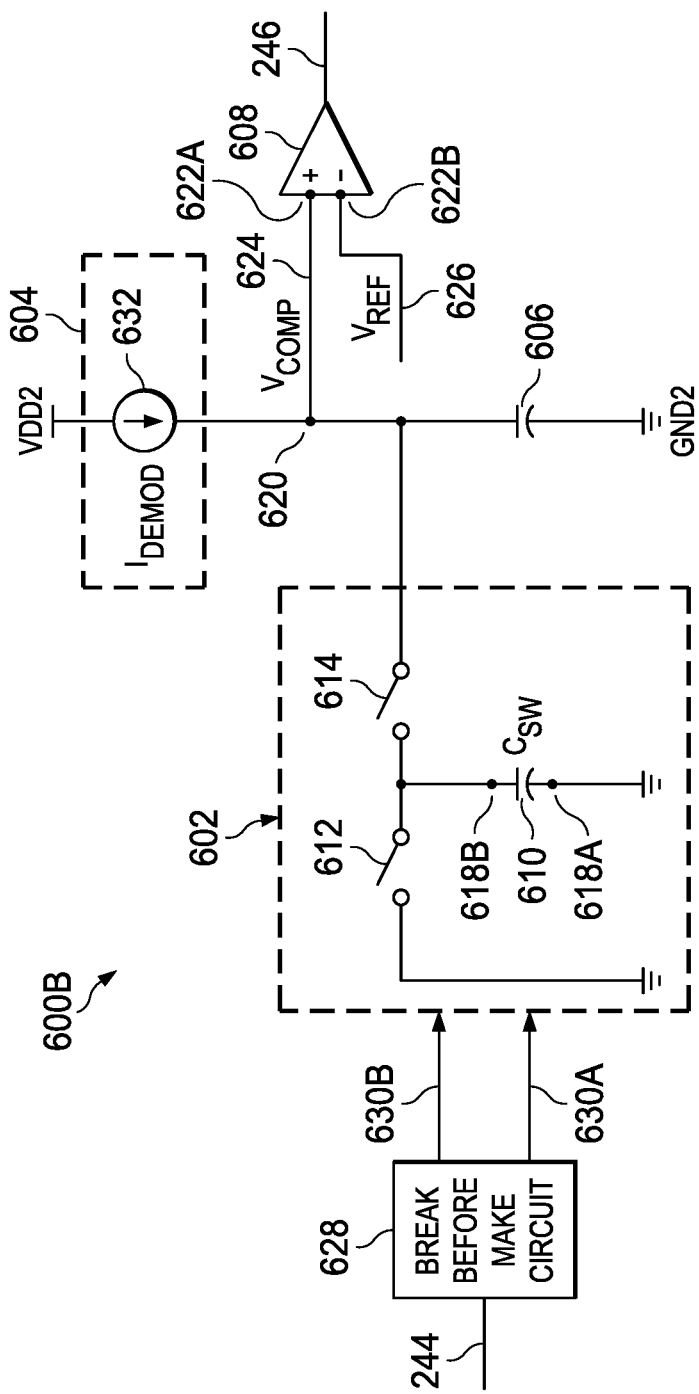

An additional example of the FSK demodulator 224, for example, a FSK demodulator 600B is shown in FIG. 6B. In addition to the components of the FSK demodulator 600A, the pull-up element 604 in the FSK demodulator 600B includes a current source 632 instead of the resistor 616.

The threshold of the demodulation comparator 608 for FIG. 6B is explained with reference to the equation (2) as given below:

$$I_{DEMOD} = V_{REF}/R_{SW} \quad (2)$$

Where, $I_{DEMOD}$ is current of the current source 632 and $R_{SW} = 1/(fclk * C_{SW})$. For frequencies higher than the threshold of the demodulation comparator 608, $V_{COMP}$ is less than $V_{REF}$.

Figure 6C:
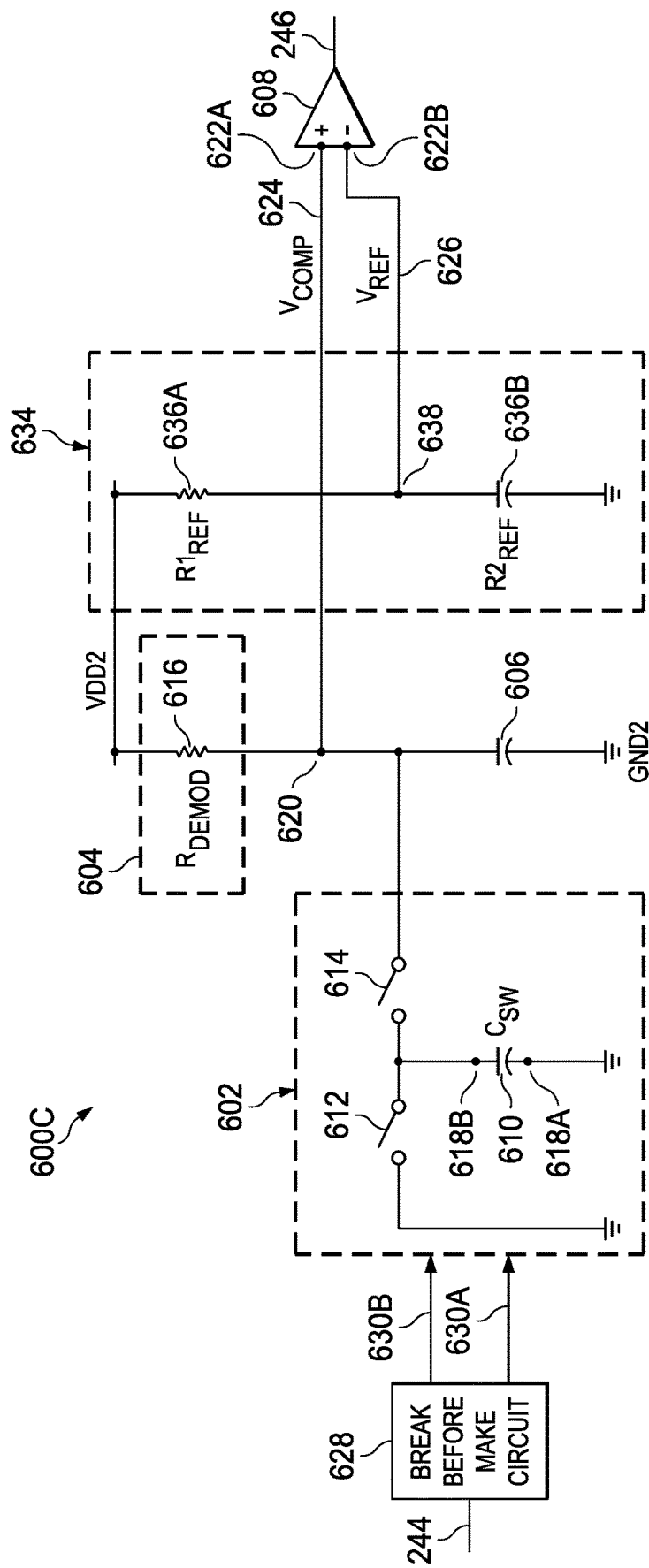

An additional example of the FSK demodulator 224, for example, a FSK demodulator 600C is shown in FIG. 6C. In addition to the components of the FSK demodulator 600A, the FSK demodulator 600C includes a voltage divider circuit 634. The voltage divider circuit 634 includes a resistor 636A and a resistor 636B in a series connection between VDD2 and GND2. The resistor 636A is electronically coupled between VDD2 and a node 638. The resistor 636B is electronically coupled between the node 638 and GND2.

The voltage divider circuit 634 generates the reference signal 626. The reference signal is further provided to the second input terminal 622B of the demodulation comparator 608.

The threshold of the demodulation comparator 608 in FIG. 6C is explained with reference to the equation (3) as given below:

$$VDD2 * R_{SW}/(R_{SW} + R_{DEMOD}) = VDD2 * (R2_{REF}/(R2_{REF} + R1_{REF})) \quad (3)$$

Where, $R1_{REF}$ and $R2_{REF}$ are resistances of the resistor 636A and the resistor 636B, and $R_{SW} = 1/(fclk * C_{SW})$. For frequencies higher than the threshold of the demodulation comparator 608, output of the FSK demodulator 224 is zero. Any variation in VDD2 cancels out as the voltage divider circuit 634 is independent of VDD2.

Figure 6D:
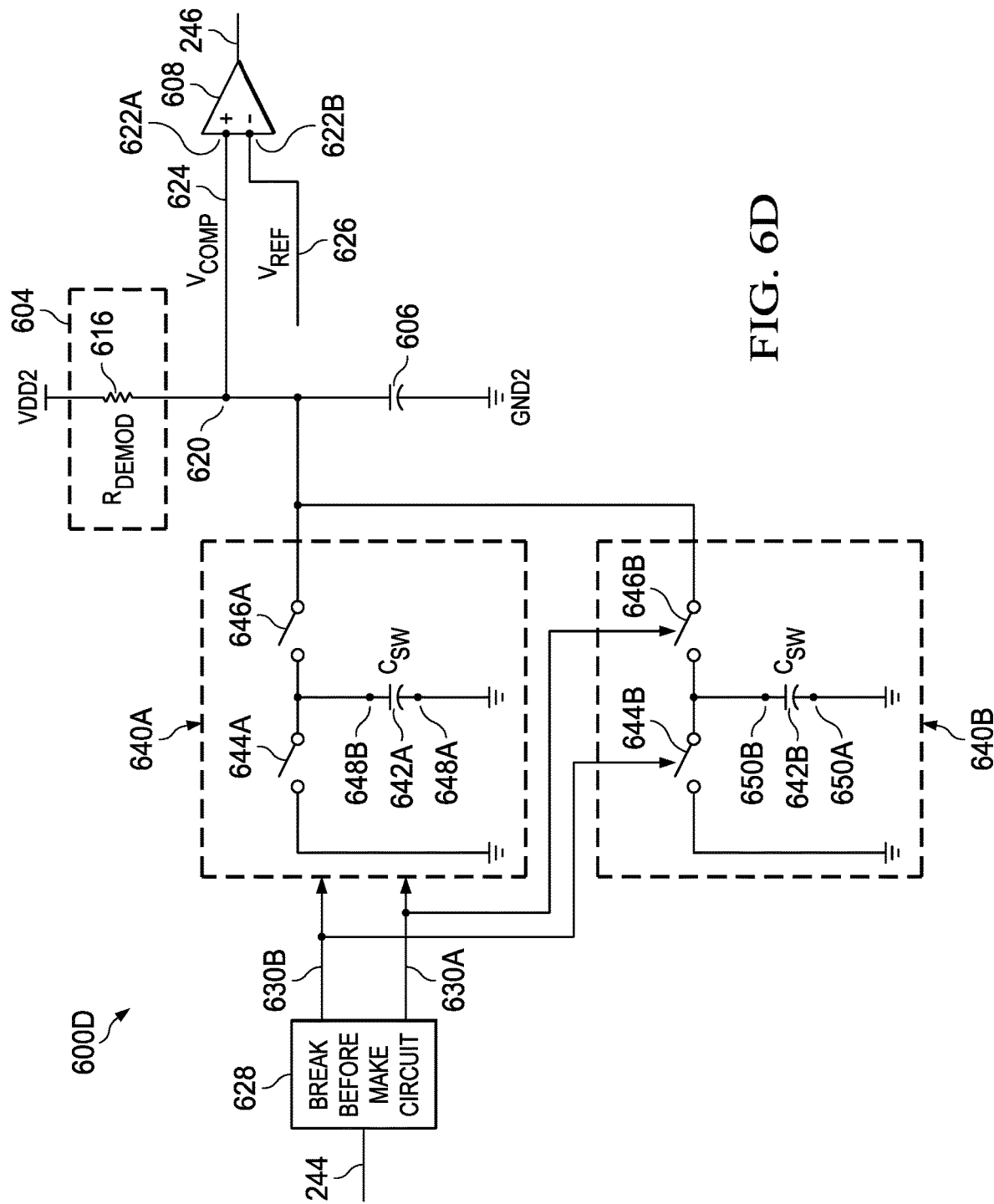

An additional example of the FSK demodulator 224, for example, a FSK demodulator 600D is shown in FIG. 6D. In addition to the components of the FSK demodulator 600A, the FSK demodulator 600D includes two switched capacitor circuits, for example a first switched capacitor circuit 640A and a second switched capacitor circuit 640B. The first switched capacitor circuit 640A and the second switched capacitor circuit 640B are similar in configuration to the switched capacitor circuit 602. The first switched capacitor circuit 640A includes a first switching capacitor 642A, a first switch 644A, and a second switch 646A. The first switching capacitor 642A includes a first terminal 648A and a second terminal 648B. The first terminal 648A is electronically coupled to GND2. The first switch 644A electronically couples the second terminal 648B of the first switching capacitor 642A to GND2. The second switch 646A is electronically coupled between the second terminal 648B of the first switching capacitor 642A and the node 620. The second switched capacitor circuit 640B includes a second switching capacitor 642B, a third switch 644B, and a fourth switch 646B. The second switching capacitor 642B includes a first terminal 650A and a second terminal 650B. The first terminal 650A is electronically coupled to GND2. The third switch 644B electronically couples the second terminal 650B of the second switching capacitor 642B to GND2. The fourth switch 646B is electronically coupled between the second terminal 650B of the second switching capacitor 642B and the node 620.

In some embodiments, the first switch 644A, the second switch 644B, the third switch 644C, and the fourth switch 644D are transistors.

The first phase signal 630A and the second phase signal 630B are electronically coupled to the first switch 644A, the second switch 644B, the third switch 644C, and the fourth switch 644D, such that when the first switching capacitor 642A charges, the second switching capacitor 642B discharges, and when the second switching capacitor 642B charges, the first switching capacitor 642A discharges.

The FSK demodulator 600D in FIG. 6D using two complimentary switching stages (the first switched capacitor circuit 640A and the second switched capacitor circuit 640B) and two switching capacitors (the first switching capacitor 642A and the second switching capacitor 642B) reduces ripple on $V_{COMP}$.

The threshold of the demodulation comparator 608 in FIG. 6D is explained with reference to the equation (4) as given below:

$$VDD2 * R_{SW}/(R_{SW}+R_{DEMOD})=V_{REF} \quad (4)$$

Where, $R_{SW}=1/(2*fclk*C_{SW})$ and for frequencies higher than the threshold of the demodulation comparator 608, $V_{COMP}$ is less than $V_{REF}$.

If the carrier signal 234 is present, the switching capacitor 610 is close to VDD2. Once the FSK demodulator 224 receives the carrier signal 234, the switching capacitor 610 slowly discharges to a lower value and settles there. The carrier signal 234 goes below the threshold of the demodulation comparator 608 when there is the carrier signal 234 and above the threshold of the demodulation comparator 608 when the carrier signal 234 is absent. The averaging capacitor 606 handles movement of the switching capacitor 610 and amount of ripple present.

The FSK demodulator 224 is not sensitive to the amplitude of the carrier signal 234 but only to presence of the carrier frequency and a very low frequency or DC signal. The FSK demodulator 224 looks for the carrier signal 234 with a certain carrier frequency and not for the carrier signal 234 with a certain amplitude, to detect Data 1. Occasional glitches are rejected as the low frequencies.

A key advantage of using the FSK demodulator 224 is that frequency content in the CMT event is low (less than 100 MHz). Hence the CMT event corrupts the amplitude of the input data signal 232 but not the carrier frequency. The FSK demodulator 224 is therefore more robust to the CMT event.

The FSK demodulator 224 as explained below (in FIGS. 6A to 6D) is used for FSK demodulation in different circuits other than the digital isolator 200.

The level shifter 226, further converts the demodulated data signal 246 in one supply domain to another. The level shifter 226 level shifts input to the FSK demodulator 224 which is on VDD2 to input output (I/O) supply. In some embodiments, except for the level shifter 226, rest of the output circuit 204 operates with VDD2. In one example, the level shifter 226 converts 1.8V output from the FSK demodulator 224 at 150 Mbps to 5 volts (V) output.

Figure 7:
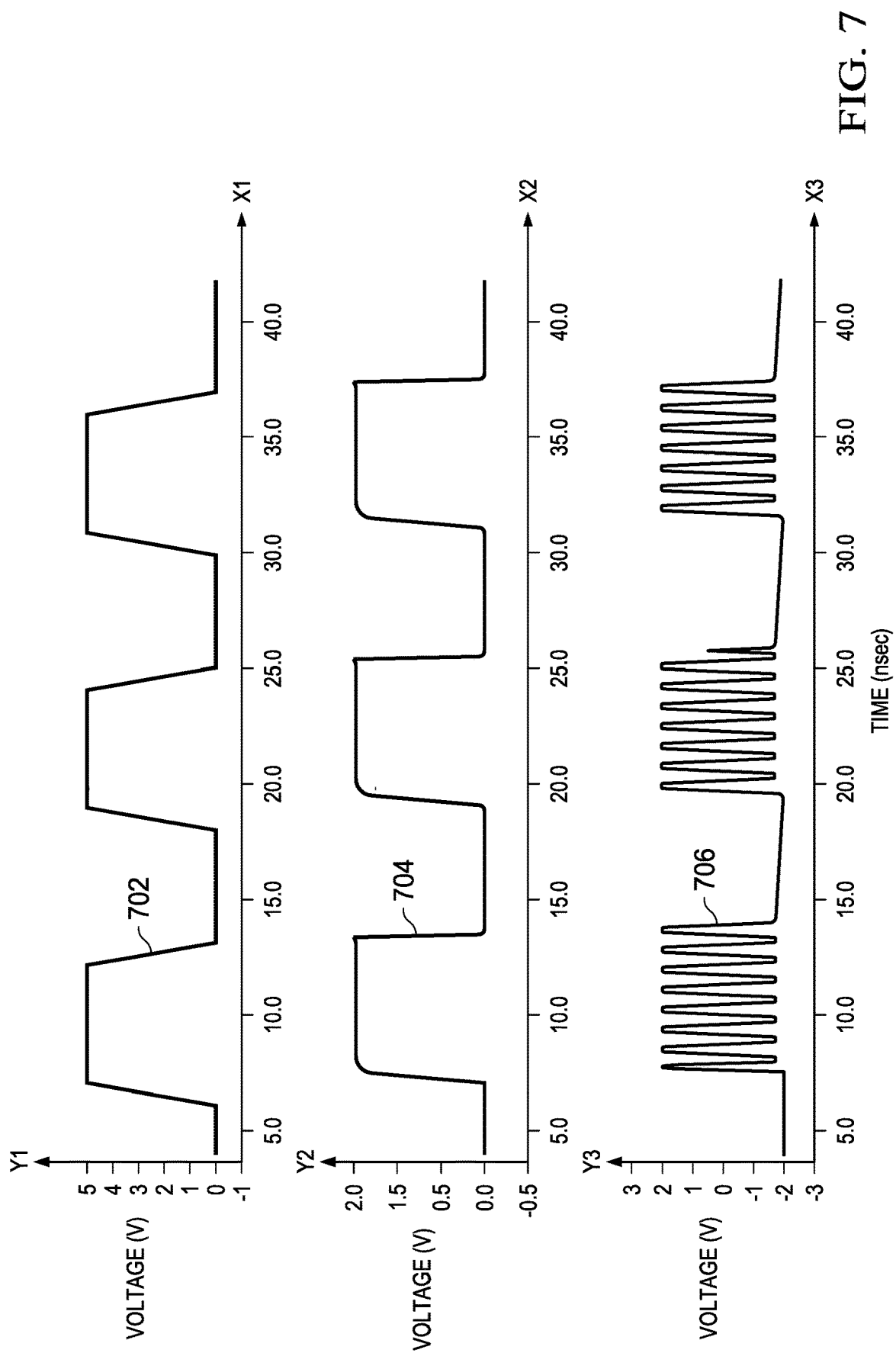
FIG. 7 is a graphical representation illustrating simulation waveforms of an input circuit in an example digital isolator, in accordance with an embodiment.

FIG. 7 is a graphical representation illustrating simulation waveforms of the input circuit 202 in the digital isolator 200. In FIG. 7, X1 axis represents a time of receipt of the input data signal 232 at an input pad from an external pin of a chip (between 5 nano seconds (nSec) to 40.0 nSec) and Y1 axis represents amplitude of the input data signal 232 received at the input pad (between 0V to 5V). A waveform 702 corresponds to the input data signal 232 received at the input pad. As illustrated in FIG. 7, the waveform 702 has a smooth variation and is a trapezoidal waveform.

In FIG. 7, X2 axis represents a time of receipt of the input data signal 232 at the modulator 212 of the input circuit 202 (between 5 nSec to 40.0 nSec) and Y2 axis represents the amplitude of the input data signal 232 received at the modulator 212 (between 0V to 2V). A waveform 704 corresponds to the input data signal 232 received at the modulator 212. As illustrated in FIG. 7, the waveform 704 has slight variation as compared to the waveform 702. The waveform 704 is a trapezoidal waveform and is also periodic.

In FIG. 7, X3 axis represents a time of receipt of a signal representative of the modulated differential data signals (240A and 240B) generated by the driver circuit 216 (between 5 nSec to 40.0 nSec) and Y3 axis represents amplitude of the signal representative of the modulated differential data signals (240A and 240B) (between −2V to 2V). A waveform 706 corresponds to the signal representative of the modulated differential data signals (240A and 240B). As illustrated in FIG. 7, the waveform 706 has a varying frequency, for example the carrier frequency of 1.15 GHz, due to the modulation of the input data signal 232 on the carrier signal 234.

The modulated differential data signals (240A and 240B) are further provided to the isolation element 206 at the input node 228A and the input node 228B.

Figure 8:
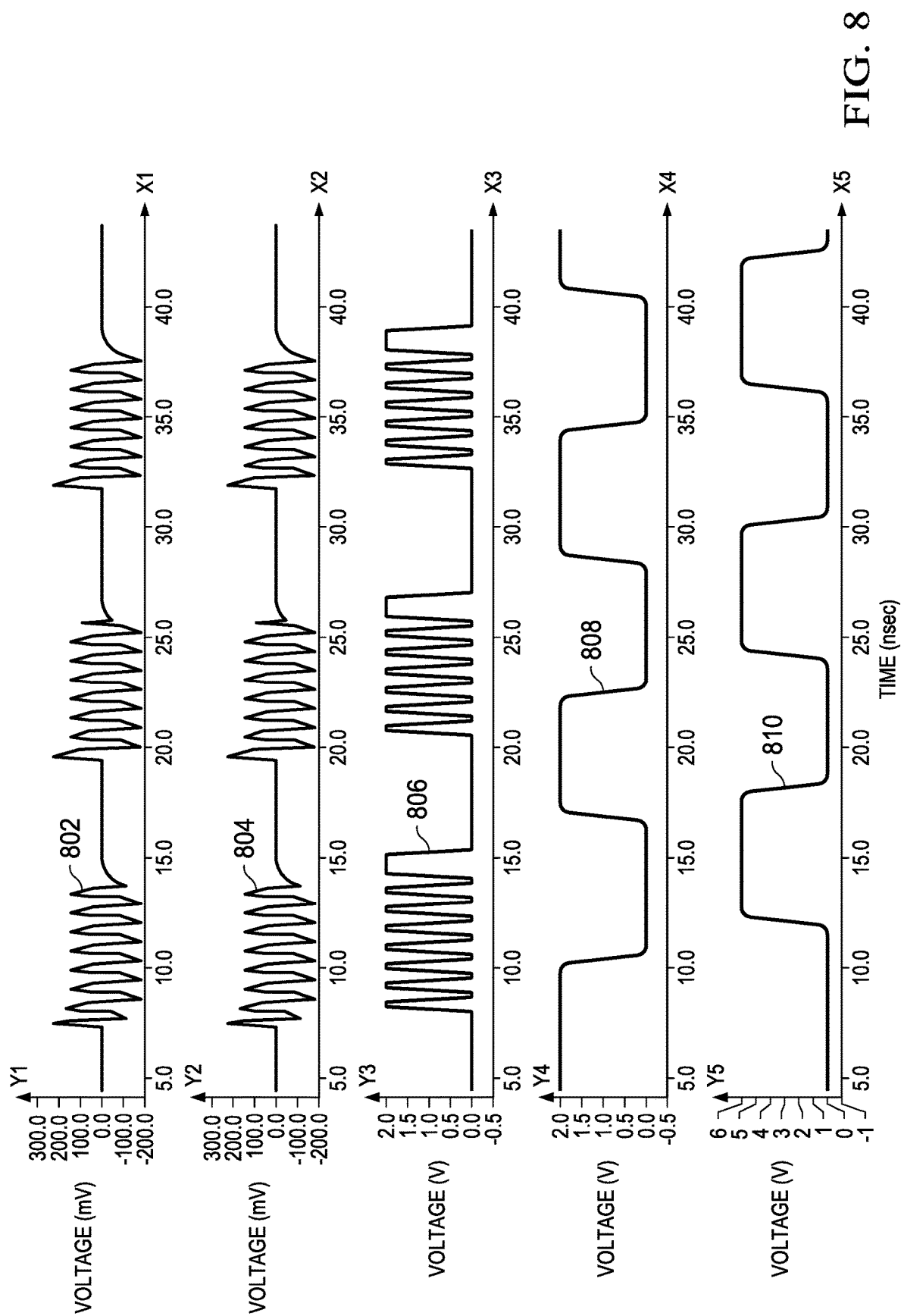
FIG. 8 is a graphical representation illustrating simulation waveforms of an output circuit in an example digital isolator, in accordance with an embodiment.

FIG. 8 is a graphical representation illustrating simulation waveforms of the output circuit 204 in the digital isolator 200. In FIG. 8, X1 axis represents a time of receipt of the signal representative of the modulated differential data signals (240A and 240B) (between 5 nSec to 40.0 nSec) and Y1 axis represents amplitude of the signal representative of the modulated differential data signals 240A and 240B) (between −200.0 mV to 200 mV). The modulated differential data signals (240A and 240B) are received from the output node 230A and the output node 230B of the isolation element 206. A waveform 802 corresponds to the signal representative of the modulated differential data signals (240A and 240B). As illustrated in FIG. 8, the waveform 802 has varying amplitude and is a periodic waveform.

In FIG. 8, X2 axis represents a time of receipt of a signal representative of the filtered modulated differential data signals (242A and 242B) generated by the filter circuit 220 (between 5 nSec to 40.0 nSec). Y2 axis represents amplitude of the signal representative of the filtered modulated differential data signals (242A and 242B) (between −200.0 mV to 200 mV). A waveform 804 corresponds to the signal representative of the filtered modulated differential data signals (242A and 242B). As illustrated in FIG. 8, the waveform 804 has varying amplitude and is a periodic waveform.

In FIG. 8, X3 axis represents a time of receipt of the amplified modulated data signals 244 generated by the comparator 222 (between 5 nSec to 40.0 nSec) and Y3 axis represents amplitude of the amplified modulated data signal 244 (between 0.0V to 2.0V). A waveform 806 corresponds to the amplified modulated data signal 244. As illustrated in FIG. 8, the waveform 806 has a varying frequency and is a periodic waveform.

In FIG. 8, X4 axis represents a time of receipt of the demodulated data signal 246 generated by the FSK demodulator 224 (between 5 nSec to 40.0 nSec) and Y4 axis represents amplitude of the demodulated data signal 246 (between 0.0V to 2.0V). A waveform 808 corresponds to the demodulated data signal 246. As illustrated in FIG. 8, the waveform 808 has a varying frequency and is a periodic waveform.

In FIG. 8, X5 axis represents a time of receipt of the output data signal 248 generated by the level shifter 226 (between 5 nSec to 40.0 nSec) and Y5 axis represents amplitude of the output data signal 248 (between 0V to 5V). A waveform 810 corresponds to the output data signal 248. As illustrated in FIG. 8, the waveform 810 has increased amplitude and is a periodic waveform.

Figure 9:
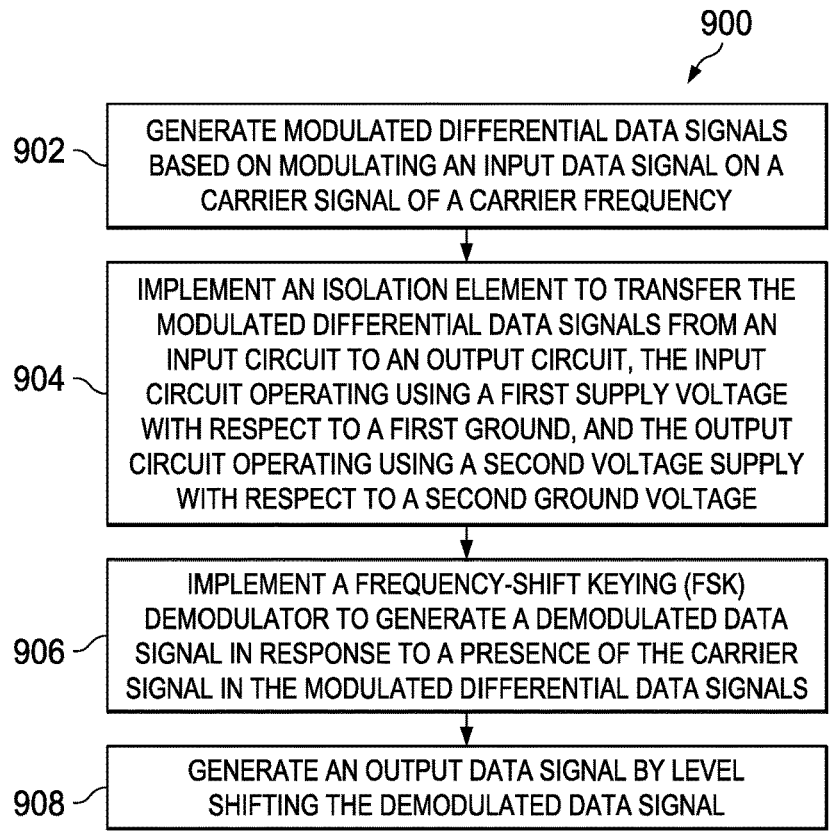
FIG. 9 illustrates a flowchart of an example method of transferring an input data signal in a digital isolator, in accordance with an embodiment.

FIG. 9 illustrates a flowchart of an example method 900 for transferring an input data signal (the input data signal 232) in a digital isolator (the digital isolator 200) as explained with reference to FIG. 2.

The input data signal and a carrier signal (the carrier signal 234) is received by an input circuit (the input circuit 202). The input data signal is modulated on the carrier signal of the carrier frequency to generate a modulated data signal. Modulated complementary signals are generated in response to the modulated data signal which is further amplified to generate modulated differential data signals (the modulated differential data signals (240A and 240B)).

At block 902, the modulated differential data signals are generated based on modulating the input data signal on the carrier signal of a carrier frequency (for example 1 GHz).

At block 904, an isolation element (the isolation element 206) is implemented to transfer the modulated differential data signals from an input circuit (the input circuit 202) to an output circuit (the output circuit 204). The input circuit operates using a first supply voltage with respect to a first ground, and the output circuit operates using a second voltage supply with respect to a second ground.

A filter circuit (the filter circuit 220) generates filtered modulated differential data signals (the filtered modulated differential data signals (242A and 242B) by attenuating common mode transient (CMT) signal components from the modulated differential data signals and by attenuating signal components including frequencies less than the carrier frequency of the carrier signal.

The filtered modulated differential data signals of the filter circuit are further amplified to an amplified modulated data signal (the amplified modulated data signal 244). The amplified modulated data signal is provided to a frequency-shift keying (FSK) demodulator (the FSK demodulator 224) for generating a demodulated data signal.

At block 906, the FSK demodulator is implemented to generate the demodulated data signal (the demodulated data signal 246) in response to a presence of the carrier signal in the modulated differential data signals.

At block 908, an output data signal (the output data signal 248) is generated by level shifting the demodulated data signal using a level shifter (the level shifter 226). The demodulated data signal in one supply domain is converted to another. In one example, the level shifter converts 1.8V output from the FSK demodulator at 150 Mbps to 5 volts (V) output.

Without in any way limiting the scope, interpretation, or application of the claims appearing below, advantages of one or more of the example embodiments disclosed herein include using frequency based signaling (FSK), which is a continuous transmission, in digital isolators. FSK allows an input data signal of a high frequency to be separated from a CMT event of a low frequency. The CMT event cannot corrupt the frequency in the input data signal. Hence, common mode transient immunity (CMTI) performance is very high. The present disclosure is also scalable to low supply voltages as the CMTI performance and supply voltage are not directly linked. For Data 0 transmission, CMTI is seen to be greater than 100 kilo volt per micro second (kV/µs), which is unavailable in systems that use carrier amplitude or energy based demodulation. Possibility of allowing amplitude changes also enable efficient design of input circuits, simplifies design of the filter circuit, and does not require a controlled gain front end for the input circuit. The present disclosure prevents lock-up in a wrong state in presence of glitches, does not require a separate DC channel, and recovers from errors within a clock period. Silicon implementation of the proposed disclosure is less than 50% of existing implementations. The proposed FSK demodulator is also used in any general FSK communication and is not limited to digital isolators, as the FSK demodulation scheme used is simple to implement and lower in power and area as compared to schemes that use demodulation through mixing with a local carrier.

Although the present technology has been described with reference to specific example embodiments, it is noted that various modifications and changes can be made to these embodiments without departing from the broad spirit and scope of the present technology. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Also, techniques, devices, subsystems and methods described and illustrated in the various embodiments as discrete or separate can be combined or integrated with other systems, modules, techniques, or methods without departing from the scope of the present technology. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present technology.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present technology. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the technology has been described based upon these example embodiments, it is noted that certain modifications, variations, and alternative constructions can be apparent and well within the spirit and scope of the technology. Although various example embodiments of the present technology are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. An output circuit for use in an isolation device, the output circuit comprising:
   a filter circuit including:
      a filter input;
      a filter output;
      a first resistor coupled between the filter input and an output ground node;
      a capacitor coupled between the filter input and the filter output; and
      a second resistor coupled between the filter output and an output supply node; and
   a demodulation circuit coupled to the filter output.

2. The output circuit of claim 1, wherein:
   the filter input includes first and second filter inputs;
   the filter output includes first and second filter outputs;
   the first resistor includes: a third resistor coupled between the first filter input and the output ground node, and a fourth resistor coupled between the second filter input and the output ground node;
   the capacitor includes: a first capacitor coupled between the first filter input and the first filter output, and a second capacitor coupled between the second filter input and the second filter output; and
   the second resistor includes: a fifth resistor coupled between the first filter output and the output supply node, and a sixth resistor coupled between the second filter output and the output supply node.

3. The output circuit of claim 2, further comprising:
   an amplifier coupled between the filter circuit and the demodulation circuit, the amplifier including:
      a first input coupled to the first filter output;
      a second input coupled to the second filter output; and
      an output coupled to the demodulation circuit.

4. The output circuit of claim 1, wherein the demodulation circuit includes a frequency-shift keying (FSK) demodulator.

5. The output circuit of claim 1, wherein the demodulation circuit includes:
   a switching capacitor coupled between a switch node and the output ground node;
   a first switch coupled between the switch node and the output ground node;
   a second switch coupled between the switch node and a compensation node;
   a pull-up element coupled between the output supply node and the compensation node;
   an averaging capacitor coupled between the compensation node and the output ground node; and
   a comparator having a non-inverting input coupled to the compensation node, an inverting input coupled to a reference voltage node, and a demodulation output.

6. The output circuit of claim 5, wherein the pull-up element includes a pull-up resistor.

7. The output circuit of claim 5, wherein the pull-up element includes a current source.

8. The output circuit of claim 5, wherein the demodulation circuit includes:
   a first reference resistor coupled between the output supply node and the reference voltage node; and
   a second reference resistor coupled between the reference voltage node and the output ground node.

9. The output circuit of claim 5, wherein the first switch is controlled by a first phase signal based on a modulation signal from the filter output, and the second switch is controlled by a second phase signal complementary to, and non-overlapping with, the first phase signal.

10. The output circuit of claim 9, wherein the demodulation circuit includes a break before make circuit configured to generate the first and second phase signals based on the modulation signal.

11. An output circuit for use in an isolation device, the output circuit comprising:
   a filter circuit including a filter input configured to receive a modulation signal, and a filter output configured to output a filtered modulation signal; and
   a demodulation circuit including:
      a switching capacitor coupled between a switch node and an output ground node;
      a first switch, coupled between the switch node and the output ground node, and controlled by a first phase signal based on the filtered modulation signal;
      a second switch, coupled between the switch node and a compensation node, and controlled by a second phase signal complementary to, and non-overlapping with, the first phase signal;
      a pull-up element coupled between an output supply node and the compensation node;
      an averaging capacitor coupled between the compensation node and the output ground node; and
      a comparator having a non-inverting input coupled to the compensation node, an inverting input coupled to a reference voltage node, and a demodulation output.

12. The output circuit of claim 11, wherein the pull-up element includes a pull-up resistor.

13. The output circuit of claim 11, wherein the pull-up element includes a current source.

14. The output circuit of claim 11, wherein the demodulation circuit includes:
   a first reference resistor coupled between the output supply node and the reference voltage node; and
   a second reference resistor coupled between the reference voltage node and the output ground node.

15. The output circuit of claim 11, wherein the demodulation circuit includes a break before make circuit configured to generate the first and second phase signals based on the filtered modulation signal.

16. An isolation device comprising:
   an input circuit, coupled between an input supply node and an input ground node, and having an input configured to receive an input data signal, and an output configured to output a modulation signal;

an isolation element having a first terminal coupled to the output of the input circuit, and a second terminal;

a filter circuit including a filter input coupled to the second terminal of the isolation element, and a filter output configured to output a filtered modulation signal; and a demodulation circuit including:
  a switching capacitor coupled between a switch node and an output ground node isolated from the input ground node;
  a first switch, coupled between the switch node and the output ground node, and controlled by a first phase signal based on the filtered modulation signal;
  a second switch, coupled between the switch node and a compensation node, and controlled by a second phase signal complementary to, and non-overlapping with, the first phase signal;
  a pull-up element coupled between the compensation node and an output supply node isolated from the input supply node;
  an averaging capacitor coupled between the compensation node and the output ground node; and
  a comparator having a non-inverting input coupled to the compensation node, an inverting input coupled to a reference voltage node, and a demodulation output.

17. The isolation device of claim 16, wherein the pull-up element includes a pull-up resistor.

18. The isolation device of claim 16, wherein the pull-up element includes a current source.

19. The isolation device of claim 16, wherein the demodulation circuit includes:
  a first reference resistor coupled between the output supply node and the reference voltage node; and
  a second reference resistor coupled between the reference voltage node and the output ground node.

20. The isolation device of claim 16, wherein the demodulation circuit includes a break before make circuit configured to generate the first and second phase signals based on the filtered modulation signal.

* * * * *